United States Patent
Rudiak et al.

(10) Patent No.: US 12,347,753 B2
(45) Date of Patent: Jul. 1, 2025

(54) SEMICONDUCTOR DEVICE HAVING GALVANIC ISOLATION AND METHOD THEREFOR

(71) Applicant: NXP USA, INC., Austin, TX (US)

(72) Inventors: Jerry Rudiak, Phoenix, AZ (US); Burton Jesse Carpenter, Austin, TX (US); Fred T. Brauchler, Canton, MI (US)

(73) Assignee: NXP USA, INC., Austin, TX (US)

( * ) Notice: Subject to any disclaimer, the term of this patent is extended or adjusted under 35 U.S.C. 154(b) by 962 days.

(21) Appl. No.: 17/473,373

(22) Filed: Sep. 13, 2021

(65) Prior Publication Data

US 2023/0085441 A1    Mar. 16, 2023

(51) Int. Cl.
*H01L 23/495* (2006.01)
*H01L 23/00* (2006.01)

(52) U.S. Cl.
CPC ........ *H01L 23/49575* (2013.01); *H01L 24/08* (2013.01); *H01L 24/48* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ... H01L 23/49575; H01L 24/08; H01L 24/48; H01L 2224/48091; H01L 2224/48247; H01L 2224/73265; H01L 2924/181; H01L 24/83; H01L 24/32; H01L 24/49; H01L 24/73; H01L 2224/32245; H01L 2224/48137; H01L 2224/48465; H01L 2224/49109; H01L 2224/49171; H01L 2224/49175; H01L 2924/00014; H01L 23/49503; H01L 23/5223; H01L 23/5227
See application file for complete search history.

(56) References Cited

U.S. PATENT DOCUMENTS

| | | |
|---|---|---|
| 9,035,422 B2 | 5/2015 | Khanolkar et al. |
| 10,446,476 B2 | 10/2019 | Higgins, III et al. |
| 2011/0039376 A1* | 2/2011 | Yamashita ........ H01L 23/49575 438/123 |
| 2012/0002377 A1 | 1/2012 | French et al. |
| 2019/0115323 A1 | 4/2019 | Haba et al. |
| 2020/0027823 A1* | 1/2020 | Carpenter ............... H01L 24/83 |
| 2021/0005539 A1 | 1/2021 | Schaller |
| 2021/0066217 A1 | 3/2021 | Carpenter et al. |

FOREIGN PATENT DOCUMENTS

EP    2674975 A1    12/2013

OTHER PUBLICATIONS

NXP Semiconductors N.V., "TJA1052i isolated high-speed CAN transceiver; HS-CAN transceiver with integrated galvanic isolation", Document order No. 9397 750 17382, Feb. 2013.

* cited by examiner

*Primary Examiner* — Robert G Bachner (57) ABSTRACT

A semiconductor device package having galvanic isolation is provided. The semiconductor device includes a package leadframe having a first die pad and a second die pad separated from the first die pad. A first semiconductor die is attached to the first die pad of the package leadframe. A second semiconductor die is attached to the second die pad of the package leadframe. A communication device is attached over the second semiconductor die. The communication device is configured to communicate wirelessly with the second semiconductor die.

20 Claims, 6 Drawing Sheets

SEMICONDUCTOR DEVICE HAVING GALVANIC ISOLATION AND METHOD THEREFOR

BACKGROUND

Field

This disclosure relates generally to semiconductor device packaging, and more specifically, to a semiconductor device having galvanic isolation and method of forming the same.

Related Art

Today, there is an increasing trend to include sophisticated semiconductor devices in products and systems that are used every day. These sophisticated semiconductor devices may include wireless communication between integrated circuit (IC) die. In such applications, electrical (or galvanic) isolation is desired between the die. "Galvanic isolation" generally means that there is no direct current (DC) electrically conductive path between distinct circuits. For example, galvanic isolation may be desired to protect a first IC die that operates at a first supply voltage from a second IC die that operates at a second supply voltage different from the first IC die.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having fault tolerant galvanic isolation. The semiconductor device includes a low voltage domain semiconductor die, a communication device, and a high voltage domain semiconductor die. The communication device and the low voltage domain semiconductor die are configured in a stack arrangement with the low voltage domain semiconductor die attached to a first die pad of a package leadframe. An isolation barrier is disposed between the communication device and the low voltage domain semiconductor die forming a galvanic isolation. The communication device and the low voltage domain semiconductor die are configured to wirelessly (e.g., inductively, capacitively) communicate and/or transfer power with one another across the isolation barrier. The high voltage domain semiconductor die is attached to a second die pad of the package leadframe. The high voltage domain semiconductor die is interconnected with the communication device so that the high voltage domain semiconductor die is galvanically isolated from the low voltage domain semiconductor die. In this manner, the high voltage domain semiconductor die and the low voltage domain semiconductor die are isolated from one another such that if an electrical overstress (EOS) event damaged (e.g., fault) the high voltage domain semiconductor die, the low voltage domain semiconductor die would remain electrically isolated from the high voltage domain semiconductor die.

Figure 1:
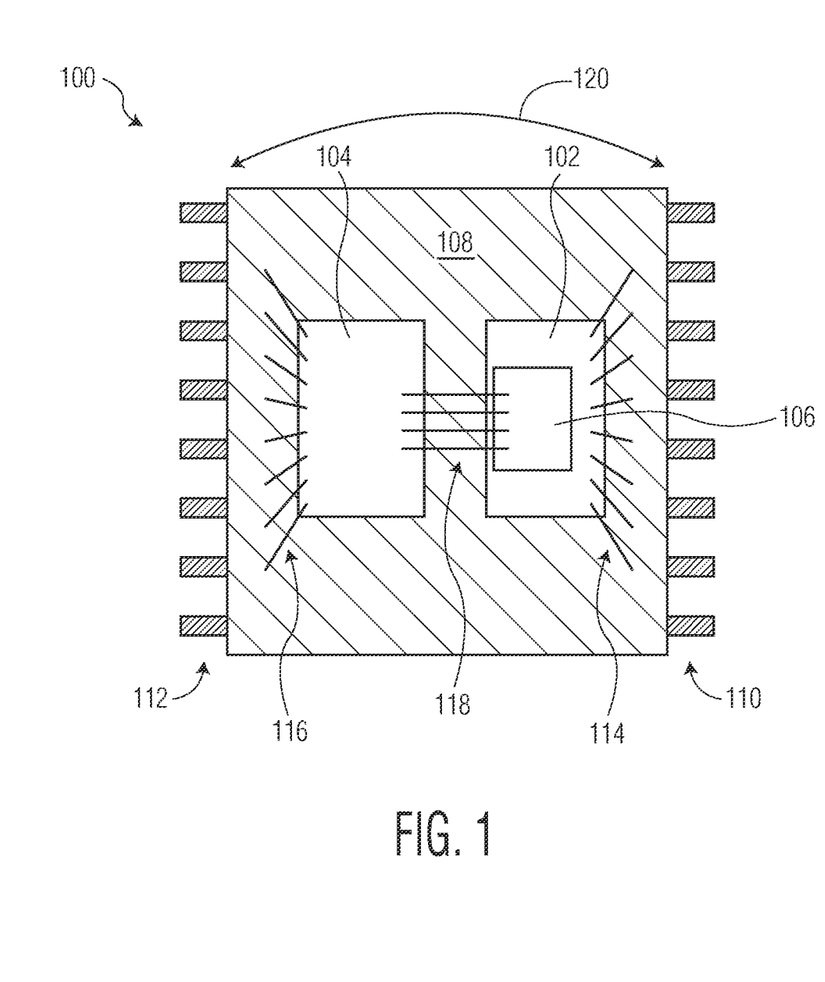
FIG. 1 illustrates, in a simplified plan view, an example semiconductor device having galvanic isolation in accordance with an embodiment.

FIG. 1 illustrates, in a simplified plan view, an example semiconductor device 100 having galvanic isolation in accordance with an embodiment. In this embodiment, the device 100 includes a first semiconductor die 102, a second semiconductor die 104, a communication device 106 stacked on the first semiconductor die, and an encapsulant 108 (e.g., epoxy molding compound) encapsulating the semiconductor die 102-104 and the communication device 106. For illustration purposes, the active sides of the semiconductor die 102-104, top side of the communication device 106, and portions of bond wires 114-118 are revealed through the encapsulant 108. Portions of leadframe leads 110 and 112 extend out of the encapsulant 108 and are configured for attachment to a printed circuit board, for example. The leadframe leads 110 and 112 are separated by a predetermined distance indicated by arrow labeled 120. In this embodiment, the predetermined distance is characterized as a clearance distance configured for high voltage isolation. The clearance distance may be defined as the distance through the air between the leadframe leads 110 and 112, for example. In this embodiment, the device 100 is configured with a predetermined clearance distance of approximately 8 millimeters to accommodate desired requirements. In other embodiments, it may be desirable to configure the device 100 with other clearance distance values. A cross-sectional view of device 100 is depicted in FIG. 2.

Figure 2:
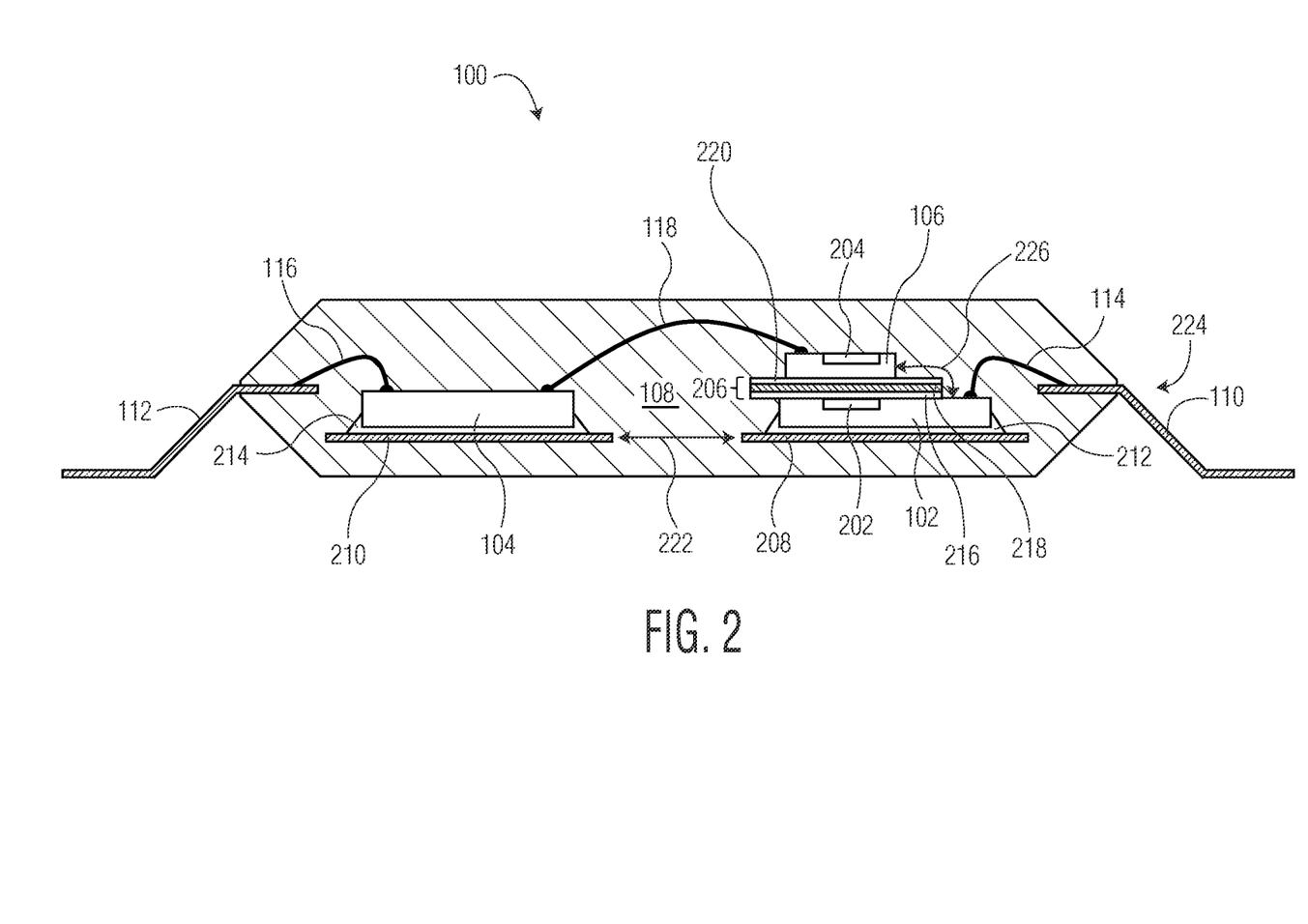
FIG. 2 illustrates, in a simplified cross-sectional view, the example semiconductor device having galvanic isolation in accordance with an embodiment.

FIG. 2 illustrates, in a simplified cross-sectional view, the example semiconductor device 100 having galvanic isolation in accordance with an embodiment. In this embodiment, the device 100 includes the semiconductor die 102-104 and the communication device 106 attached to a package leadframe 224, an isolation barrier 206 disposed between the semiconductor die 102 and the communication device 106, interconnecting bond wires 114-118, and the encapsulant 108. The package leadframe 224 includes leadframe leads 110 and 112 and separate die pads 208 and 210. The die pads 208 and 210 are separated by a predetermined distance (e.g., approximately 500 microns) configured for high voltage isolation indicated by arrow labeled 222. The die pads 208 and 210 may be further configured for heat dissipation by way of connections to one or more leadframe leads (not shown).

The semiconductor die 102 has an active side (e.g., major side having circuitry) and a backside (e.g., major side opposite of the active side). In this embodiment, the backside of the semiconductor die 102 is attached to a first die pad 208 of the package leadframe 224 by way of a die attach material 212. The semiconductor die 102 includes an inductive coil (e.g., inductor) 202 formed therein and bond pads (not shown) at the active side configured for interconnection with leadframe lead 110 of the package leadframe 224 by way of bond wire 114, for example. As illustrated, the inductive coil 202 is formed at the active side of the semiconductor die 102. In some embodiments, the inductive coil 202 may be embedded within the semiconductor die 102 or formed at the backside. Note that the semiconductor die 102 may include any number of inductive coils configured for wireless communication. The semiconductor die 102 may be formed from any suitable semiconductor material, such as silicon, germanium, gallium arsenide, gallium nitride, silicon carbide, and the like. In this embodiment, the semiconductor die 102 may be characterized as a low voltage die, for example. The term "low voltage" as used herein generally refers to an operating voltage in a first voltage domain, for example, sufficient for operation of CMOS digital circuitry. In this embodiment, the semiconductor die 102 may serve as a controller device configured to control functions of the semiconductor die 104 by way of a wireless communication link.

The semiconductor die 104 has an active side and a backside. In this embodiment, the backside of the semiconductor die 104 is attached to a second die pad 210 of the package leadframe 224 by way of die attach material 214. The semiconductor die 104 includes bond pads (not shown) at the active side configured for interconnection with leadframe lead 112 of the package leadframe 224 by way of bond wire 116, for example. The semiconductor die 104 may be formed from any suitable semiconductor material, such as silicon, germanium, gallium arsenide, gallium nitride, silicon carbide, and the like. In this embodiment, the semiconductor die 104 may be characterized as a high voltage die, for example. The term "high voltage" as used herein generally refers to an operating voltage in a second voltage domain sufficient for operation of circuitry such as insulated-gate bipolar transistors (IGBT), for example. In this embodiment, the second voltage domain is different from the first voltage domain, for example, having voltage values different from the first voltage domain. The second voltage domain may be electrically isolated and offset from the first voltage domain. For example, the second voltage domain may be offset from the first voltage domain by ~400 volts, ~800 volts, or other voltages.

In this embodiment, the isolation barrier 206 is affixed at the active side of the semiconductor die 102. The isolation barrier 206 may be formed as a prefabricated structure including a first adhesive layer 216, an isolation layer 218, and a second adhesive layer 220. Alternatively, the isolation barrier layers 216-220 may be formed or applied sequentially, or in other suitable process flows. The isolation barrier 206 is affixed at the active side of the semiconductor die 102 by way of the adhesive layer 216, for example. The isolation layer 218 is configured and arranged to provide galvanic isolation and resist electrical overstress breakdown. For example, the isolation layer 218 may be specified with a predetermined voltage overstress requirement (e.g., withstand 5000 volts over 60 seconds). The isolation layer 218 may include FR-4, bismaleimide triazine (BT), dielectric, epoxy, or polyimide materials, for example. The adhesive layers 216 and 220 may be in the form of a die attach film (DAF) or other adhesive material suitable for die attachment.

The communication device 106 has a top side and a backside. In this embodiment, the backside of the communication device 106 is attached to the isolation barrier 206 by way of the adhesive layer 216. The communication device 106 is positioned on the isolation barrier according to a predetermined internal creepage distance 226 (e.g., approximately 500 microns) between the communication device 106 and the semiconductor die 102. The internal creepage distance is configured for high voltage isolation and may be defined as the distance of the shortest path along the surface of the isolation barrier between the communication device 106 and the semiconductor die 102, for example. The communication device 106 includes an inductive coil 204 formed therein and bond pads (not shown) at the top side configured for interconnection with the semiconductor die 104 by way of bond wire 118, for example. As illustrated, the inductive coil 204 is formed at the top side of the communication device 106. In some embodiments, the inductive coil 204 may be embedded within the communication device 106 or formed at the backside. The communication device 106 may include a number of inductive coils configured for wireless communication which corresponds with a number of inductive coils included in the semiconductor die 102, for example. The communication device 106 may be in the form of a semiconductor die or a multilayer structure including conductive traces separated by non-conductive dielectric material (e.g., FR-4, barium titanate, ceramic, alumina, alumina nitride, the like). The communication device 106 may include passive components (e.g., resistors, capacitors, inductors) as well as active components (e.g., transistors, diodes, amplifiers, integrated circuits). In this embodiment, the communication device 106 may be characterized as a semiconductor die configured for wireless communication, for example.

The wireless communication link is formed between the semiconductor die 102 and the communication device 106 by way of inductive coils 202 and 204 configured and arranged for inductive coupling across the isolation barrier 206. In this embodiment, the semiconductor die 104 is configured for receiving commands from and/or transferring information with the semiconductor die 102 by way of the wireless communication link.

Figure 3:
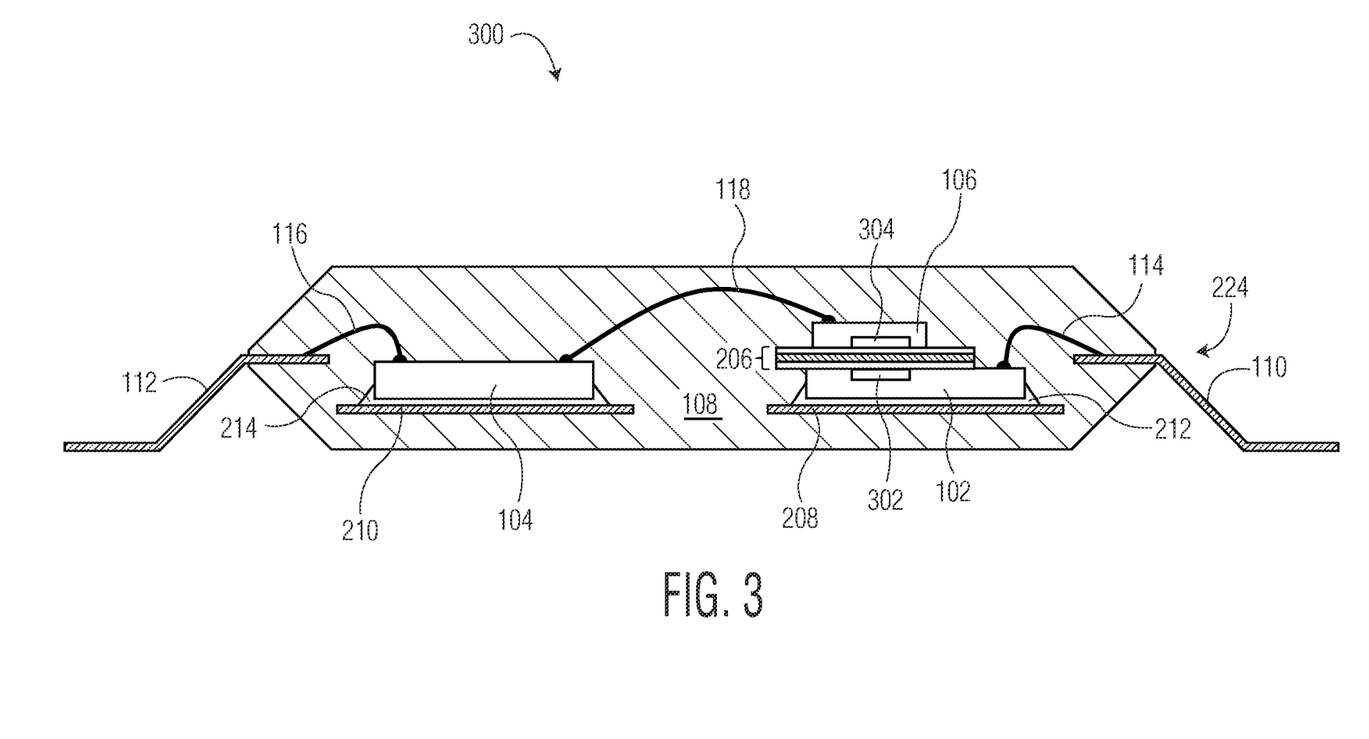
FIG. 3 illustrates, in a simplified cross-sectional view, the example semiconductor device having galvanic isolation and an alternative communication form in accordance with an embodiment.

FIG. 3 illustrates, in a simplified cross-sectional view, an alternative example semiconductor device 300 having galvanic isolation in accordance with an embodiment. Like the device 100, the device 300 includes the semiconductor die 104 attached to die pad 210 and stacked communication device 106 over semiconductor die 102 attached to die pad 208 of the package leadframe 224, the isolation barrier 206 disposed between the semiconductor die 102 and the communication device 106, bond wires 114-118 interconnecting the semiconductor die 102-104, the communication device 106, and leadframe leads 110-112, and the encapsulant 108.

In this alternative embodiment, the semiconductor die 102 includes a capacitor plate 302 formed therein and configured for wireless communication. As illustrated, the capacitor plate 302 is formed at the active side of the semiconductor die 102. In some embodiments, the capacitor plate 302 may be embedded within the semiconductor die 102 or formed at the backside. Note that the semiconductor die 102 may include any number of capacitor plates 302 configured for wireless communication. In this embodiment, the semiconductor die 102 may be characterized as a low voltage die configured for operation in a first voltage domain, for example. In this embodiment, the semiconductor die 102 may serve as a controller device configured to control functions of the semiconductor die 104 by way of a capacitively coupled wireless communication link including the capacitor plate 302.

In this embodiment, the communication device 106 includes a capacitor plate 304 formed therein and configured for wireless communication with semiconductor die 102, for example. As illustrated, the capacitor plate 304 is formed or attached at the backside of the communication device 106 and interconnected with the active side by way of a through via (not shown), for example. In some embodiments, the capacitor plate 304 may be embedded within the communication device 106 or formed at the top side. The communication device 106 may include a number of capacitor plates 304 configured for wireless communication which corresponds with a number of capacitor plates 302 included in the semiconductor die 102, for example. The communication device 106 may be in the form of a semiconductor die or a multilayer structure including conductive traces separated by non-conductive dielectric material. The communication device 106 may include passive components as well as active components. In this embodiment, the communication device 106 may be characterized as a semiconductor die having a wired interconnect with semiconductor die 104 by way of bond wire 118 and having a wireless link with semiconductor die 102 by way of capacitor plates 302 and 304.

The wireless communication link is formed between the semiconductor die 102 and the communication device 106 by way of the capacitor plates 302 and 304 configured and arranged for capacitive coupling across the isolation barrier 206. In this embodiment, the semiconductor die 104 is configured for operation in a second voltage domain different from the first voltage domain. To maintain proper galvanic isolation, the semiconductor die 104 is configured for receiving commands from and/or transferring information with the semiconductor die 102 by way of the wireless communication link.

Figure 4:
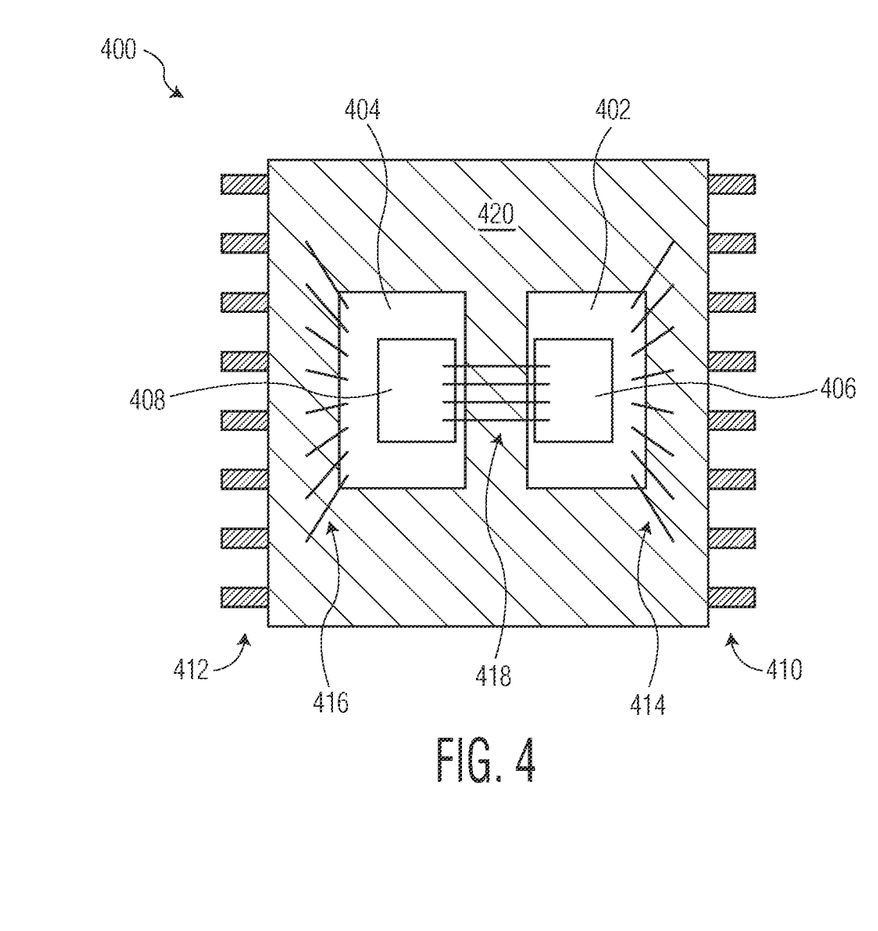
FIG. 4 illustrates, in a simplified plan view, an alternative example semiconductor device having galvanic isolation in accordance with an embodiment.

FIG. 4 illustrates, in a simplified plan view, an alternative example semiconductor device 400 having galvanic isolation in accordance with an embodiment. In this embodiment, the device 400 includes a first semiconductor die 402, a second semiconductor die 404, a first communication device 406 stacked on the semiconductor die 402, a second communication device 408 stacked on the semiconductor die 404, and an encapsulant 420 (e.g., epoxy molding compound) encapsulating the semiconductor die 402-404 and communication devices 406-408. For illustration purposes, the active sides of the semiconductor die 402-404, top sides of the communication devices 406-408, and portions of bond wires 414-418 are revealed through the encapsulant 420. Portions of leadframe leads 410 and 412 extend out of the encapsulant 420 and are configured for attachment to a printed circuit board, for example. The leadframe leads 410 and 412 are separated by a predetermined distance characterized as a clearance distance configured for high voltage isolation. In this embodiment, the device 400 is configured with a predetermined clearance distance of approximately 8 millimeters to accommodate desired requirements. In other embodiments, it may be desirable to configure the device 400 with other clearance distance values. A cross-sectional view of device 400 is depicted in FIG. 5.

Figure 5:
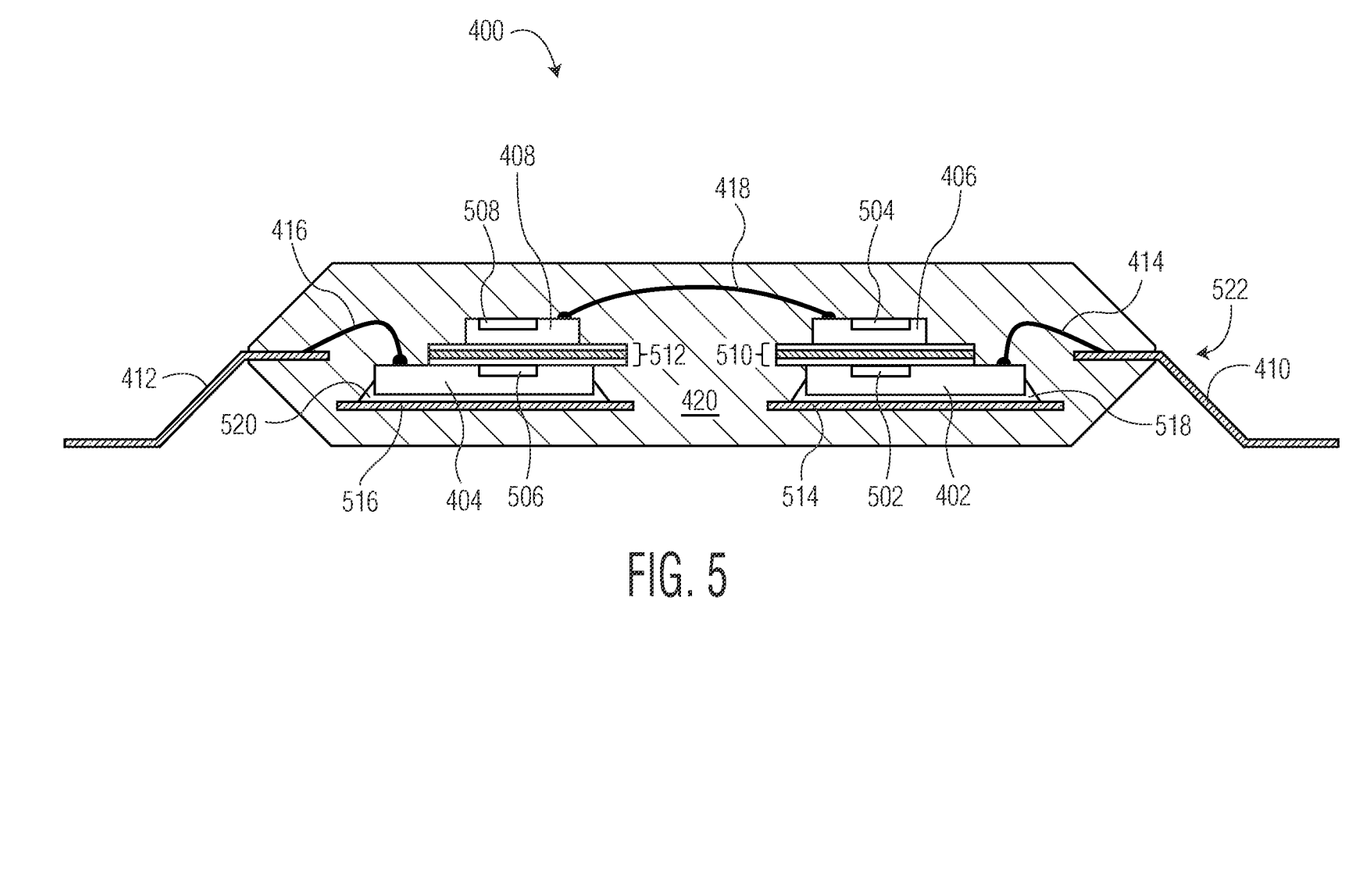
FIG. 5 illustrates, in a simplified cross-sectional view, the alternative example semiconductor device having galvanic isolation in accordance with an embodiment.

FIG. 5 illustrates, in a simplified cross-sectional view, the example semiconductor device 400 having galvanic isolation in accordance with an embodiment. In this embodiment, the device 400 includes the semiconductor die 402-404 and the stacked communication devices 406-408 attached to a package leadframe 522, a first isolation barrier 510 disposed between the semiconductor die 402 and the communication device 406, a second isolation barrier 512 disposed between the semiconductor die 404 and the communication device 408, interconnecting bond wires 414-418, and the encapsulant 420. The package leadframe 522 includes leadframe leads 410 and 412 and separate die pads 514 and 516.

In this embodiment, a backside of the semiconductor die 402 is attached to a first die pad 514 of the package leadframe 522 by way of a die attach material 518. The semiconductor die 402 includes an inductive coil (e.g., inductor) 502 formed therein and bond pads (not shown) configured for interconnection with leadframe lead 410 of the package leadframe 522 by way of bond wire 414, for example. As illustrated, the inductive coil 502 is formed at an active side of the semiconductor die 402. In some embodiments, the inductive coil 502 may be embedded within the semiconductor die 402 or formed at the backside. Note that the semiconductor die 402 may include any number of inductive coils configured for wireless communication. In this embodiment, the semiconductor die 402 may be referred to as a low voltage die configured for operation in a first voltage domain, for example. In this embodiment, the semiconductor die 402 may serve as a controller device configured to control functions of the semiconductor die 404 by way of wireless communication links.

A backside of the semiconductor die 404 is attached to a second die pad 516 of the package leadframe 522 by way of a die attach material 520. The semiconductor die 404 includes an inductive coil (e.g., inductor) 506 formed therein and bond pads (not shown) configured for interconnection with leadframe lead 412 of the package leadframe 522 by way of bond wire 416, for example. As illustrated, the inductive coil 506 is formed at an active side of the semiconductor die 404. In some embodiments, the inductive coil 506 may be embedded within the semiconductor die 404 or formed at the backside. Note that the semiconductor die 404 may include any number of inductive coils configured for wireless communication. In this embodiment, the semiconductor die 404 may be referred to as a high voltage die configured for operation in a second voltage domain. In this embodiment, the second voltage domain is different from the first voltage domain, for example, having voltage values different from the first voltage domain. The second voltage domain may be electrically isolated and offset from the first voltage domain. For example, the second voltage domain may be offset from the first voltage domain by a predetermined voltage or range of voltages.

In this embodiment, the isolation barrier 510 is affixed at the active side of the semiconductor die 402 and the isolation barrier 512 is affixed at the active side of the semiconductor die 404. The each of the isolation barriers 510 and 512 may be formed as a prefabricated structure including a top adhesive layer and a bottom adhesive layer with an isolation layer sandwiched in between the adhesive layers. Alternatively, the isolation barrier layers may be formed or applied sequentially, or in other suitable process flows. The isolation barrier 510 is affixed at the active side of the semiconductor die 402 by way of the bottom adhesive layer of the isolation barrier 510, for example. Likewise, the isolation barrier 512 is affixed at the active side of the semiconductor die 404 by way of the bottom adhesive layer of the isolation barrier 512. The isolation layer of each of the isolation barriers 510 and 512 is configured and arranged to provide galvanic isolation and resist electrical overstress breakdown. For example, the isolation layer may be specified with a predetermined voltage overstress requirement. The isolation layer may include FR-4, bismaleimide triazine (BT), dielectric, epoxy, or polyimide materials, for example. The top and bottom adhesive layers may be in the form of a die attach film (DAF) or other adhesive material suitable for die attachment.

The communication devices 406 and 408 are attached to respective isolation barriers 510 and 512 by way of the top adhesive layers of the isolation barriers thus forming stacked-die arrangements with respective semiconductor die 402 and 404. Each of the communication devices 406 and 408 is positioned on the respective isolation barrier according to an internal creepage distance requirement. The communication device 406 includes an inductive coil 504 and the communication device 408 includes an inductive coil 508. Bond pads (not shown) located at the active sides of the communication devices 406 and 408 are configured for interconnection with one another by way of bond wire 418, for example. As illustrated, the inductive coils 504 and 508 are formed at the active side of the communication devices 406 and 408 respectively. In some embodiments, the inductive coils 504 and 508 may be embedded within the communication devices 406 and 408 or formed at the backside. The communication devices 406 and 408 may each include a number of inductive coils which corresponds with a number of inductive coils included in the respective semiconductor die 402 and 404, for example.

In this embodiment, the communication devices 406 and 408 may be characterized as semiconductor die or as multilayer structures including conductive traces separated by non-conductive dielectric material (e.g., FR-4, barium titanate, ceramic, alumina, alumina nitride, the like). A first wireless communication link is formed between the semiconductor die 402 and the communication device 406 by way of inductive coils 502 and 504 configured and arranged for inductive coupling across the isolation barrier 510. Likewise, a second wireless communication link is formed between the semiconductor die 404 and the communication device 408 by way of inductive coils 506 and 508 configured and arranged for inductive coupling across the isolation barrier 512. A communication path between semiconductor die 402 and semiconductor die 404 is formed by way of the first and second wireless communication links and interconnecting bond wire 418. In this embodiment, the semiconductor die 404 is configured for receiving commands from and/or transferring information with the semiconductor die 402 by way of the communication path. For example, a command from semiconductor die 402 is transmitted wirelessly to the communication device 406 then transferred to the communication device 408 by way of the wired connection. In turn, the command is transmitted wirelessly from the communication device 408 to semiconductor die 404.

Figure 6:
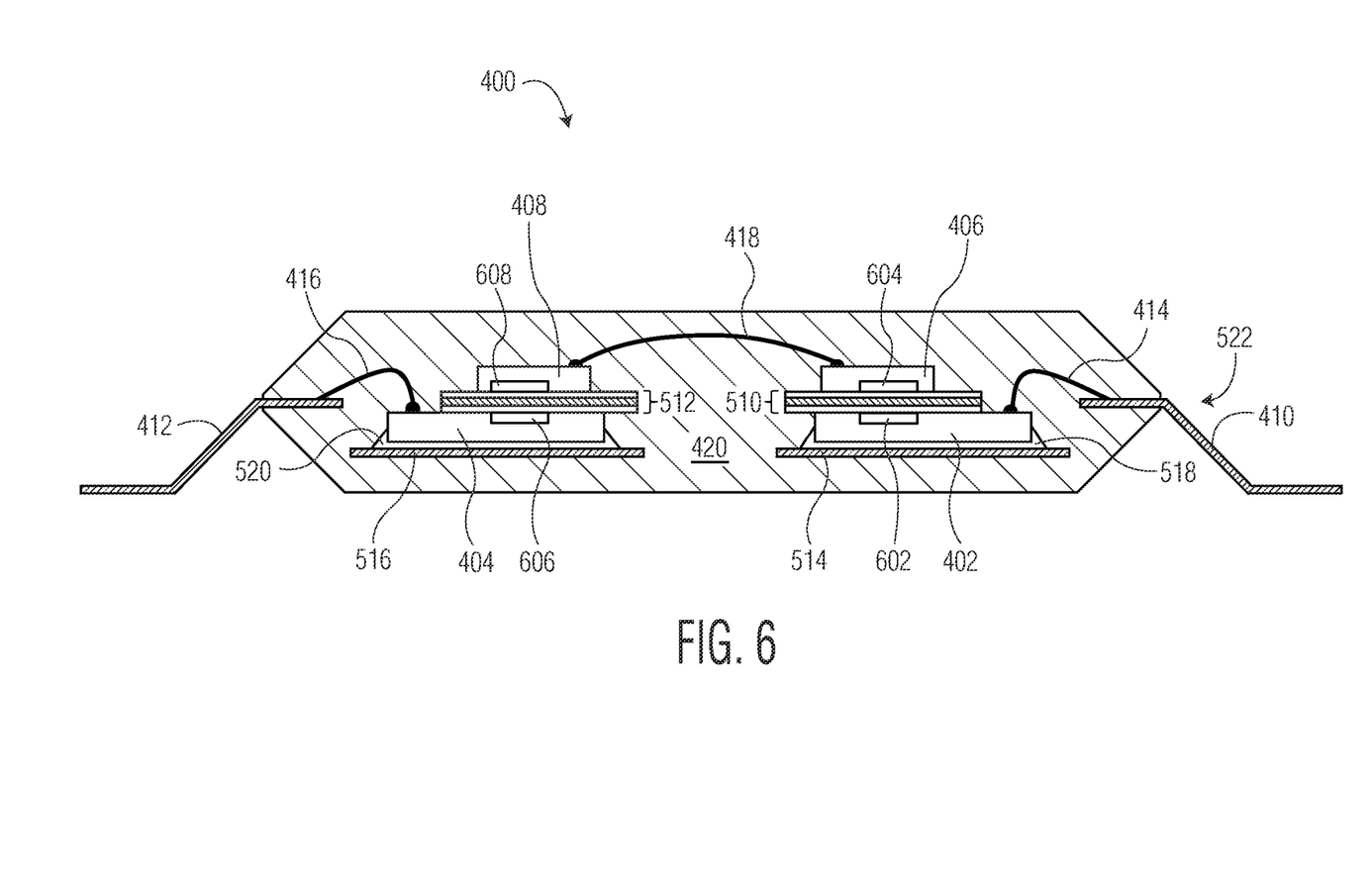
FIG. 6 illustrates, in a simplified cross-sectional view, the alternative example semiconductor device having galvanic isolation and an alternative communication form in accordance with an embodiment.

FIG. 6 illustrates, in a simplified cross-sectional view, an alternative example semiconductor device 600 having galvanic isolation in accordance with an embodiment. Like the device 400, the device 600 includes the semiconductor die 402 and stacked communication device 406 attached to die pad 514 and the semiconductor die 404 and stacked communication device 408 attached to die pad 516 of the package leadframe 522, the isolation barrier 510 disposed between the semiconductor die 402 and communication device 406, the isolation barrier 512 disposed between the semiconductor die 404 and communication device 408, bond wires 414-418 interconnecting semiconductor die 402-408 and leadframe leads 410-412, and the encapsulant 420.

In this alternative embodiment, the semiconductor die 402 includes a capacitor plate 602 formed therein and configured for wireless communication. As illustrated, the capacitor plate 602 is formed at the active side of the semiconductor die 402. In some embodiments, the capacitor plate 602 may be embedded within the semiconductor die 402 or formed at the backside. Note that the semiconductor die 402 may include any number of capacitor plates 602 configured for wireless communication. In this embodiment, the semiconductor die 402 may be characterized as a low voltage die configured for operation in a first voltage domain, for example. In this embodiment, the semiconductor die 402 may serve as a controller device configured to control functions of the semiconductor die 404 by way of capacitively coupled wireless communication links including the capacitor plate 602.

Similarly, the semiconductor die 404 includes a capacitor plate 606 formed therein and configured for wireless communication. As illustrated, the capacitor plate 606 is formed at the active side of the semiconductor die 404. In some embodiments, the capacitor plate 606 may be embedded within the semiconductor die 404 or formed at the backside. Note that the semiconductor die 404 may include any number of capacitor plates 606 configured for wireless communication. In this embodiment, the semiconductor die 404 may be characterized as a high voltage die configured for operation in a second voltage domain different from the first voltage domain. In this embodiment, the semiconductor die 404 may serve as a driver device configured for receiving commands from and/or transferring information with the semiconductor die 402 by way of capacitively coupled wireless communication links including the capacitor plate 606.

The communication device 406 includes a capacitor plate 604 formed therein and configured for wireless communication with semiconductor die 402, for example. As illustrated, the capacitor plate 604 is formed or attached at the backside of the communication device 406 and interconnected with the active side by way of a through via (not shown), for example. In some embodiments, the capacitor plate 604 may be embedded within the communication device 406 or formed at the top side. The communication device 406 may include a number of capacitor plates 604 which corresponds with a number of capacitor plates 602 included in the semiconductor die 402, for example.

Similarly, the communication device 408 includes a capacitor plate 608 formed therein and configured for wireless communication with semiconductor die 404, for example. As illustrated, the capacitor plate 608 is formed or attached at the backside of the communication device 408 and interconnected with the active side by way of a through silicon via (not shown), for example. In some embodiments, the capacitor plate 608 may be embedded within the communication device 408 or formed at the top side. The communication device 408 may include a number of capacitor plates 608 which corresponds with a number of capacitor plates 606 included in the semiconductor die 404, for example.

In this embodiment, the communication devices 406 and 408 may be characterized as semiconductor die or as multilayer structures including conductive traces separated by non-conductive dielectric material (e.g., FR-4, barium titanate, ceramic, alumina, alumina nitride, the like). A first wireless communication link is formed between the semiconductor die 402 and the communication device 406 by way of capacitor plates 602 and 604 configured and arranged for capacitive coupling across the isolation barrier 510. Likewise, a second wireless communication link is formed between the semiconductor die 404 and the communication device 408 by way of capacitor plates 606 and 608 configured and arranged for capacitive coupling across the isolation barrier 512. A communication path between semiconductor die 402 and semiconductor die 404 is formed by way of the first and second wireless communication links and interconnecting bond wire 418. In this embodiment, the semiconductor die 402 and 404 are configured for communication with one another by way of the communication path.

Generally, there is provided, a semiconductor device including a package leadframe having a first die pad and a second die pad, the second die pad separated from the first die pad; a first semiconductor die attached to the first die pad of the package leadframe; a second semiconductor die attached to the second die pad of the package leadframe; and a communication device attached over the second semiconductor die, the communication device configured to communicate wirelessly with the second semiconductor die. The semiconductor device may further include an isolation barrier disposed between the second semiconductor die and the communication device. The communication device may be interconnected to the first semiconductor die by way of a bond wire. The second die pad may be separated from the first die pad by a predetermined distance, the predetermined distance configured for high voltage isolation. The second semiconductor die may include a first inductive coil, and the communication device may include a second inductive coil substantially aligned with the first inductive coil, a wireless communication link between the second semiconductor die and the communication device formed by way of the first and second inductive coils. The first semiconductor die may be interconnected to a first lead of the package leadframe by way of a first bond wire, and the second semiconductor die may be interconnected to a second lead of the package leadframe by way of a second bond wire, the second lead separated from the first lead by a predetermined distance configured for high voltage isolation. The first semiconductor die may be configured for operation in a first voltage domain, and the second semiconductor die may be configured for operation in a second voltage domain, the second voltage domain having voltage values different from the first voltage domain. The communication device may be characterized as a semiconductor die configured to communicate wirelessly with the second semiconductor die. The semiconductor device may further include a second communication device attached over the first semiconductor die, the second communication device configured to communicate wirelessly with the first semiconductor die.

In another embodiment, there is provided, a method of manufacturing a semiconductor device including providing a package leadframe having a first die pad and a second die pad, the second die pad separated from the first die pad; attaching a first semiconductor die to the first die pad of the package leadframe; attaching a second semiconductor die to the second die pad of the package leadframe; attaching an isolation barrier on the second semiconductor die; attaching a communication device on the isolation barrier; and forming a wireless communication link between the communication device and the second semiconductor die. The method may further include interconnecting the communication device with the first semiconductor die by way of a bond wire. The second semiconductor die may include a first inductive coil, and the communication device may include a second inductive coil substantially aligned with the first inductive coil, the wireless communication link between the communication device and the second semiconductor die formed by way of the first and second inductive coils. The first semiconductor die may be configured for operation in a first voltage domain, and the second semiconductor die may be configured for operation in a second voltage domain, the second voltage domain having voltage values different from the first voltage domain. The second semiconductor die includes or may be coupled to a first capacitor plate, and the communication device includes or may be coupled to a second capacitor plate substantially aligned with the first capacitor plate, the wireless communication link between the communication device and the second semiconductor die formed by way of a capacitor including the first and second capacitor plates. The method may further include interconnecting the first semiconductor die with a first lead of the package leadframe by way of a first bond wire; and interconnecting the second semiconductor die with a second lead of the package leadframe by way of a second bond wire, the second lead separated from the first lead by a predetermined distance, the predetermined distance configured for high voltage isolation.

In yet another embodiment, there is provided, a semiconductor device including a package leadframe having a first die pad and a second die pad, the second die pad separated from the first die pad; a first semiconductor die attached to the first die pad of the package leadframe; a second semiconductor die attached to the second die pad of the package leadframe; an isolation barrier having a first major side attached to the second semiconductor die; and a communication device attached to a second major side of the isolation barrier in a stacked configuration with the second die, the communication device interconnected to the first semiconductor die by way of a first bond wire and configured to communicate wirelessly with the second semiconductor die. The first semiconductor die may be configured for operation in a first voltage domain, and the second semiconductor die may be configured for operation in a second voltage domain, the second voltage domain having voltage values different from the first voltage domain. The second die pad may be separated from the first die pad by a predetermined distance, the predetermined distance configured for high voltage isolation. The second semiconductor die may include a first inductive coil, and the communication device may include or may be coupled to a second inductive coil substantially aligned with the first inductive coil, a wireless communication link between the second semiconductor die and the communication device formed by way of the first and second inductive coils. The first semiconductor die may be interconnected to a first lead of the package leadframe by way of a second bond wire, and the second semiconductor die may be interconnected to a second lead of the package leadframe by way of a third bond wire, the second lead separated from the first lead by a predetermined distance, the predetermined distance configured for high voltage isolation.

By now, it should be appreciated that there has been provided a semiconductor device having fault tolerant galvanic isolation. The semiconductor device includes a low voltage domain semiconductor die, a communication device, and a high voltage domain semiconductor die. The communication device and the low voltage domain semiconductor die are configured in a stack arrangement with the low voltage domain semiconductor die attached to a first die pad of a package leadframe. An isolation barrier is disposed between the communication device and the low voltage domain semiconductor die forming a galvanic isolation. The communication device and the low voltage domain semiconductor die are configured to wirelessly communicate and/or transfer power with one another across the isolation barrier. The high voltage domain semiconductor die is attached to a second die pad of the package leadframe. The high voltage domain semiconductor die is interconnected with the communication device so that the high voltage domain semiconductor die is galvanically isolated from the low voltage domain semiconductor die. In this manner, the high voltage domain semiconductor die and the low voltage domain semiconductor die are isolated from one another such that if an EOS event damaged the high voltage domain semiconductor die, the low voltage domain semiconductor die would remain electrically isolated from the high voltage domain semiconductor die.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
a package leadframe having a first die pad and a second die pad, the second die pad separated and electrically isolated from the first die pad;
a first semiconductor die attached to the first die pad of the package leadframe;
a second semiconductor die attached to the second die pad of the package leadframe; and
a communication device attached over the second semiconductor die, the communication device configured to communicate wirelessly with the second semiconductor die.

2. The semiconductor device of claim 1, further comprising an isolation barrier disposed between the second semiconductor die and the communication device.

3. The semiconductor device of claim 1, wherein the communication device is interconnected to the first semiconductor die by way of a bond wire.

4. The semiconductor device of claim 1, wherein the second die pad is separated from the first die pad by a predetermined distance, the predetermined distance configured for high voltage isolation.

5. The semiconductor device of claim 1, wherein:
the second semiconductor die includes a first inductive coil; and
the communication device includes a second inductive coil substantially aligned with the first inductive coil, a wireless communication link between the second semiconductor die and the communication device formed by way of the first and second inductive coils.

6. The semiconductor device of claim 1, wherein:
the first semiconductor die is interconnected to a first lead of the package leadframe by way of a first bond wire; and
the second semiconductor die is interconnected to a second lead of the package leadframe by way of a second bond wire, the second lead separated from the first lead by a predetermined distance configured for high voltage isolation.

7. The semiconductor device of claim 1, wherein:
the first semiconductor die is configured for operation in a first voltage domain; and
the second semiconductor die is configured for operation in a second voltage domain, the second voltage domain having voltage values different from the first voltage domain.

8. The semiconductor device of claim 1, wherein the communication device is characterized as a semiconductor die configured to communicate wirelessly with the second semiconductor die.

9. The semiconductor device of claim 1, further comprising a second communication device attached over the first semiconductor die, the second communication device configured to communicate wirelessly with the first semiconductor die.

10. A method of manufacturing a semiconductor device, the method comprising:
providing a package leadframe having a first die pad and a second die pad, the second die pad separated and electrically isolated from the first die pad;
attaching a first semiconductor die to the first die pad of the package leadframe;
attaching a second semiconductor die to the second die pad of the package leadframe;
attaching an isolation barrier on the second semiconductor die;
attaching a communication device on the isolation barrier; and
forming a wireless communication link between the communication device and the second semiconductor die.

11. The method of claim 10, further comprising interconnecting the communication device with the first semiconductor die by way of a bond wire.

12. The method of claim 10, wherein:
the second semiconductor die includes a first inductive coil; and
the communication device includes a second inductive coil substantially aligned with the first inductive coil, the wireless communication link between the communication device and the second semiconductor die formed by way of the first and second inductive coils.

13. The method of claim 10, wherein:
the first semiconductor die is configured for operation in a first voltage domain; and
the second semiconductor die is configured for operation in a second voltage domain, the second voltage domain having voltage values different from the first voltage domain.

14. The method of claim 10, wherein:
the second semiconductor die includes or is coupled to a first capacitor plate; and
the communication device includes or is coupled to a second capacitor plate substantially aligned with the first capacitor plate, the wireless communication link between the communication device and the second semiconductor die formed by way of a capacitor including the first and second capacitor plates.

15. The method of claim 10, further comprising:
interconnecting the first semiconductor die with a first lead of the package leadframe by way of a first bond wire; and
interconnecting the second semiconductor die with a second lead of the package leadframe by way of a second bond wire, the second lead separated from the first lead by a predetermined distance, the predetermined distance configured for high voltage isolation.

16. A semiconductor device comprising:
a package leadframe having a first die pad and a second die pad, the second die pad separated and electrically isolated from the first die pad;
a first semiconductor die attached to the first die pad of the package leadframe;
a second semiconductor die attached to the second die pad of the package leadframe;
an isolation barrier having a first major side attached to the second semiconductor die; and
a communication device attached to a second major side of the isolation barrier in a stacked configuration with the second die, the communication device interconnected to the first semiconductor die by way of a first bond wire and configured to communicate wirelessly with the second semiconductor die.

17. The semiconductor device of claim 16, wherein:
the first semiconductor die is configured for operation in a first voltage domain; and
the second semiconductor die is configured for operation in a second voltage domain, the second voltage domain having voltage values different from the first voltage domain.

18. The semiconductor device of claim 16, wherein the second die pad is separated from the first die pad by a predetermined distance, the predetermined distance configured for high voltage isolation.

19. The semiconductor device of claim 16, wherein:
the second semiconductor die includes a first inductive coil; and
the communication device includes or is coupled to a second inductive coil substantially aligned with the first inductive coil, a wireless communication link between the second semiconductor die and the communication device formed by way of the first and second inductive coils.

20. The semiconductor device of claim 16, wherein:
the first semiconductor die is interconnected to a first lead of the package leadframe by way of a second bond wire; and
the second semiconductor die is interconnected to a second lead of the package leadframe by way of a third bond wire, the second lead separated from the first lead by a predetermined distance, the predetermined distance configured for high voltage isolation.

* * * * *